(12) United States Patent
Wang

(10) Patent No.: US 6,949,826 B2
(45) Date of Patent: Sep. 27, 2005

(54) HIGH DENSITY SEMICONDUCTOR PACKAGE

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 25 days.

(21) Appl. No.: 10/605,660

(22) Filed: Oct. 16, 2003

(65) Prior Publication Data

US 2004/0104475 A1 Jun. 3, 2004

(30) Foreign Application Priority Data

Oct. 25, 2002 (TW) .................................... 91125100 A

(51) Int. Cl.⁷ ............................................. H01L 23/52
(52) U.S. Cl. ..................................... 257/737; 257/678
(58) Field of Search ................................ 257/737, 678, 257/679, 673, 723, 724, 779

(56) References Cited

U.S. PATENT DOCUMENTS

| | | | | |
|---|---|---|---|---|
| 5,856,937 A | * | 1/1999 | Chu et al. ...................... | 365/51 |
| 5,990,564 A | * | 11/1999 | Degani et al. ............... | 257/778 |
| 6,475,830 B1 | * | 11/2002 | Brillhart ...................... | 438/109 |
| 6,610,560 B2 | * | 8/2003 | Pu et al. ...................... | 438/122 |
| 6,696,765 B2 | * | 2/2004 | Kazama et al. ............. | 257/779 |
| 6,732,304 B1 | * | 5/2004 | Ong ........................... | 714/718 |

* cited by examiner

Primary Examiner—David Nelms
Assistant Examiner—Thinh T Nguyen
(74) Attorney, Agent, or Firm—Jianq Chyun IP Office

(57) ABSTRACT

A high density semiconductor package comprises a substrate, a first package module and a plurality of second package modules. The substrate has a surface on which the first package module and the second package modules are disposed, wherein the second package modules surround the first package module.

7 Claims, 3 Drawing Sheets

HIGH DENSITY SEMICONDUCTOR PACKAGE

CROSS REFERENCE TO RELATED APPLICATIONS

This application claims the priority benefit of Taiwan application serial no. 91125100, filed Oct. 25, 2002.

BACKGROUND OF INVENTION

1. Field of the Invention

The invention relates to a high density semiconductor package, and more particularly to a thin high-density semiconductor package.

2. Description of the Related Art

Semiconductor package is essential for connecting chips with an external circuit board such as a printed circuit board (PCB). To connect a chip and a package substrate, wires or bumps are usually used as connection media. Flip Chip Interconnection Technology is utilized to form bumps in an array on bonding pads of a chip and after the chip being flipped, the chip can be electrically connected to the package substrate. The chip is electrically connected with external signal terminals through the internal circuits and connection pads of the substrate. The structure of packages has become increasingly versatile with increasing package density of chips. The chip package using the Flip Chip Interconnection Technology described above has several advantages including reductions in package area and signal transmission pathways. Therefore, the Flip Chip Interconnection Technology has been widely used in the industry of chip package. A Multi-Chip Module, for example, is a package structure in which several package modules of Chip Scale Package (CSP) are mounted on a single substrate by using the Flip Chip Interconnection Technology. The package modules are electrically connected with each other through the substrate.

Several dynamic random access memories (DRAMs) and one Central Process Unit (CPU), for example, can be packaged on a single substrate in a MCM type, which is capable of increasing package density, save space, as well as reduce the signal delay between the package modules. Consequently, high-speed data processing can be achieved by the MCM package, which is widely used in communication and portable electronic products.

FIGS. 1A and 1B are schematic cross-sectional and top views of a conventional package structure with multiple package modules disposed on a motherboard 10. Referring to FIGS. 1A and 1B, the package structure includes a substrate 100, a first package module 110, and four second package modules 112. The two surfaces 102 and 104 of the substrate 100 are respectively provided with a plurality of connection pads (not shown) as input/output media for the internal circuits in the substrate 100. The first package module 110, for example, comprised of a CPU, is provided in the central area of the lower surface 102 of the substrate 100, and the second package modules 112, for example, comprised of four DRAMs, are located on the four corners of the upper surface 104 of the substrate 100. In addition, the first package module 110 and the second package modules 112 are electrically connected with the substrate 100 by using the bumps 106. An underfill 108 is dispensed between the package modules 110, 112 and the substrate 100 and surrounding the bumps 106 to buffer stress resulting from the different coefficients of thermal expansion between the package modules 110, 112 and the substrate 100. For example, if the stress occurs, cracks can be generated in the bumps 106, and thereby adversely affecting the quality of the signal transmissions between the package modules 110, 112 and the substrate 100.

Further, as shown in FIGS. 1A and 1B, the total thickness D of the package structure is the sum of the thickness of the substrate 100, the first package module 110 and the second package module 112, which is relatively large, and therefore do not conform to the trend of lightness, thinness, shortness, and smallness. Moreover, when the chip inside the first package module 110 is operated in high frequency, a large amount of heat will be generated, leading to a drastic increase in the temperature of the chip. It is noted that, once the temperature rises above the normal operating temperature range, the internal circuits of the chip will behave erroneously or malfunction temporarily. Moreover, the first package module 110, a CPU, for example, is disposed on the lower surface 102 of the substrate 100, making it impossible to install heat sink member on the CPU. Even if the heat of the CPU can be dissipated through the motherboard 10, it cannot be dissipated effectively.

SUMMARY OF INVENTION

Accordingly, one object of the present invention is to provide a high density semiconductor package in which a plurality of package modules are disposed on the same surface of the substrate so that the thickness of the package structure can be significantly reduced, and thereby conforming the trend of lightness, thinness, flatness, shortness, and smallness.

Another object of the present invention is to provide a high density semiconductor package in which a heat sink member can be disposed on the package module to enhance the dissipation of the heat generated by the chip in the package module.

In accordance with the above objects, as broadly embodied and described herein, a high density semiconductor package is provided. The high density semiconductor package of the present invention comprises a substrate, a first package module, and a plurality of second package modules. The substrate has a surface on which the first package module and the second package modules are mounted, wherein the second package modules surround the first package module.

According to one preferred embodiment of the present invention, the first package module and the second package modules are comprised of chip size packages, each chip size package include a chip and a plurality of bumps, wherein the bumps are provided between the chips and the substrate to electrically connect the chips to the substrate. Further, an underfill is provided between the first and the second package modules to cover the bumps.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
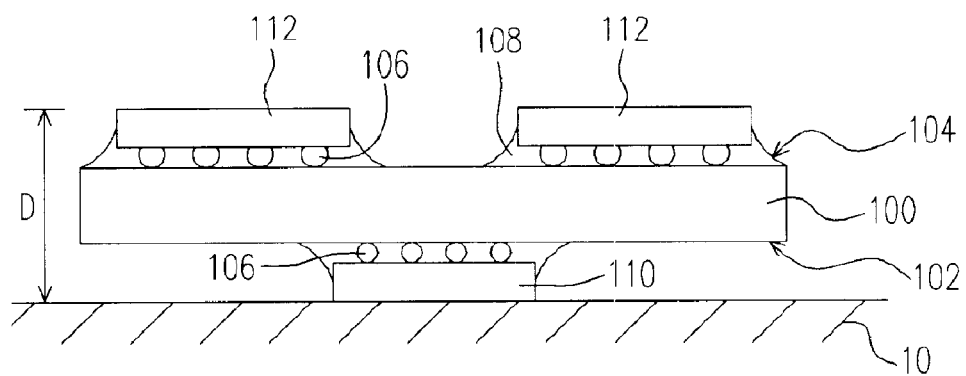
FIGS. 1A and 1B are schematic cross-sectional and top views showing a traditional package structure with multi package modules disposed on a motherboard.
Figure 1B:
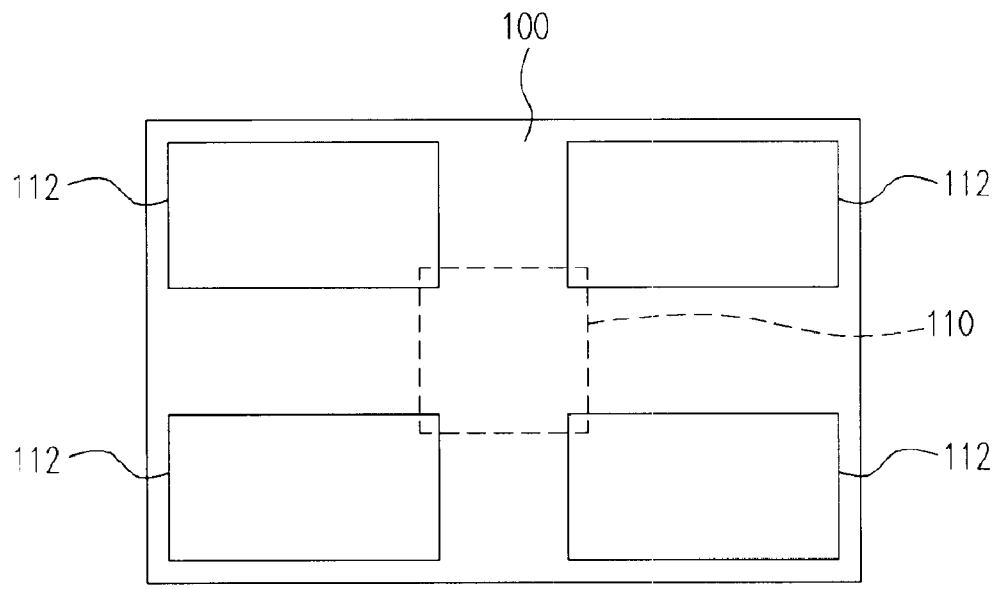
Figure 2A:
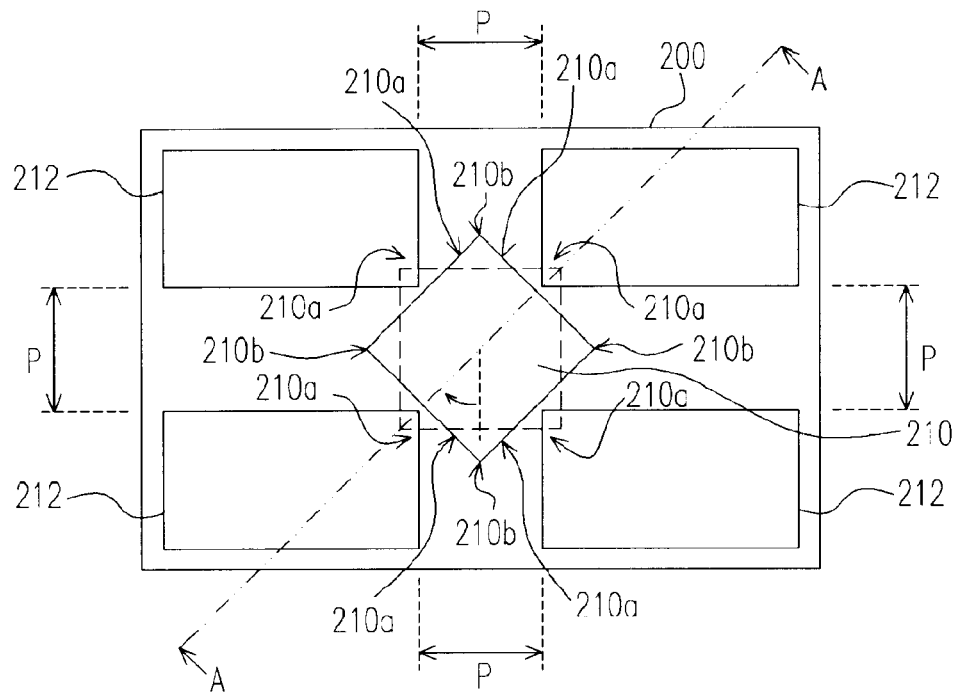
FIG. 2A is a schematic top view of a high density semiconductor package disposed on a mother board according to a preferred embodiment of the present invention.
Figure 2B:
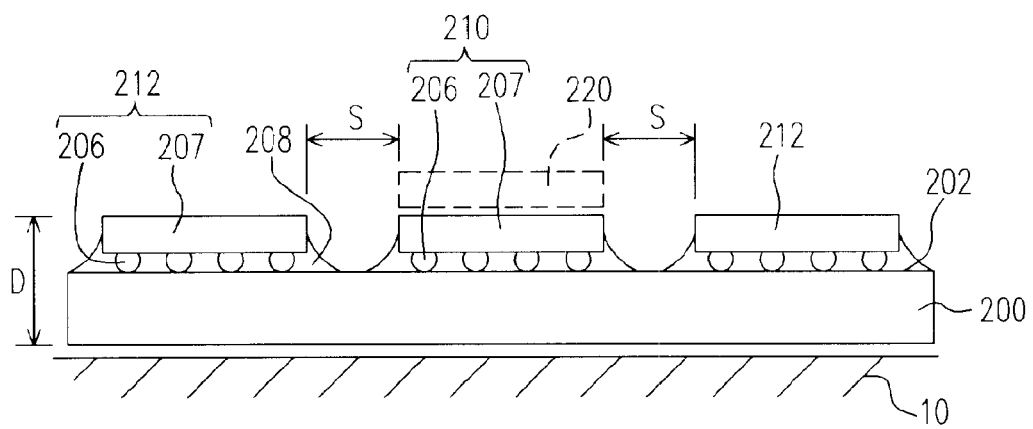
FIG. 2B is a schematic cross-sectional view taken along line A—A of FIG. 2A.

Referring to FIGS. 2A and 2B, FIG. 2A is a schematic top view of a high density semiconductor package disposed on a mother board according to a preferred embodiment of the prevention; and FIG. 2B is a schematic cross-sectional view taken along line A—A of the high density semiconductor package structure in FIG. 2A. A substrate 200 has an upper surface 202 on which a plurality of connection pads (not shown) are provided as input/output media for the internal circuits of the substrate 200. Moreover, a first package module 210 and four second package modules 212 are disposed on the upper surface 202 of the substrate 200. It is to be noted that the first package module 210 and the four second package modules 212 are disposed on the same surface of the substrate 200. Consequently, the total thickness of the high density semiconductor package, d, can be greatly reduced. In addition, the first package module 210, a CPU, for example, is disposed on the central area of the upper surface 202 of the substrate 200 and remain exposed until the encapsulation step. Consequently, this arrangement allows disposing a heat sink member 220 on the first package module 210 so that the heat generated by the first package module 210 can be effectively dissipated through the heat sink member 220. Alternatively, a heat-dissipating material can be disposed on the first package module 210, and thereby the cooling rate of the chip can be enhanced. Moreover, the four second package modules 212, DRAMs, for example, are disposed on the four corner portions on the upper surface 202 of the substrate 200 surrounding the first package module 210. Consequently, the distance between the second package modules 212 and the first package module 210 is significantly reduced, thereby shortening the signal transmission pathways between the two modules.

Furthermore, each of the package modules 210 and 212 is a Chip Scale Packages (CSPs) type, for example, composed of a chip 207 and a plurality of bumps 206. The chips 207 are electrically connected with the substrate 200 by using the bumps 206. An underfill 208 can be dispensed using an adhesive dispenser into the gap between the chip 207 and the substrate 200 to envelop the bumps 206.

As shown in FIG. 2A, the first package module 210 and the four second package modules 212 are Chip Scale Packages (CSPs) are suitable for the substrate with a small area and a limited space (for thickness in particular). It is noted that, if the first package module 210 is arranged substantially orthogonal to second package modules 212, then relatively a larger surface area is required to accommodate the second package modules 212 surrounding the first package module 210. For instance, if the surface area of the substrate 200 is limited for confining the first and the second package modules, and if the first package module 210 is arranged substantially orthogonal to the second package modules 212 (as shown in dashed lines in FIG. 2A), then the corner of the first package module 210 will overlap with the corner 212a of the second package modules 212. Accordingly, it is preferable to arrange the second package modules 212 surrounding the first package module 210 in a manner that a corner of each second package module 212 face a side of the first package module 210 so that relatively larger gap width, preferably at least 2.0 mm or more than 2.0 mm, between the first package module 210 and the second package modules 212 as shown by reference "S" in FIG. 2B can be maintained allowing reliable filling of the underfill material therein.

Figure 3:
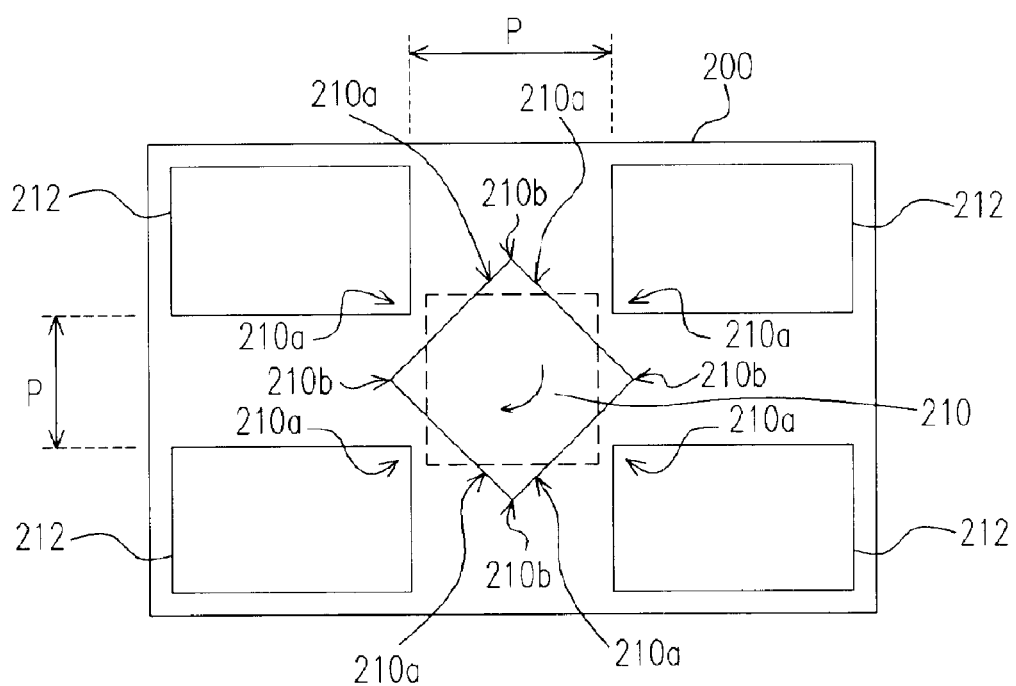
FIG. 3 is a schematic top view of an arrangement of a plurality of package modules according to another preferred embodiment of the present invention.

Referring to FIG. 3, a schematic top view showing an arrangement of a plurality of package modules according to another preferred embodiment of the present invention. Although the surface area of the substrate 200 is large enough to accommodate the first and second package modules 210, 212 with the first package module 210 being arranged substantially orthogonal to second package modules without overlapping the corners thereof, however, there will be a very narrow gap between the corners of the first package module 210 the corner 212a of the second package modules 212, which is less than 2 mm. Thus, it would be very difficult to reliably apply the underfill therein. However, it is to be noted that if the gap between the corners of the first package module 210 and the corner 212a of the second package modules is large enough, preferably at least 2.0 mm or larger than 2.0 mm, is required to reliably apply the underfill material, then this arrangement can also be used to practice the present invention.

Accordingly, the present invention provides an arrangement including five (5) chip size package modules on the same surface of the package substrate to make the high-density package having the desirable features of enhanced heat dissipation and at the same time being light, thin, flat, short and small.

Although the preferred embodiment of the present is described using a first package module and four second package modules for constructing the high density semiconductor package as an example, however, the present invention is not restricted to only four second package modules, instead one, two, three or more than four second package modules can also be arranged on the same surface of the high density semiconductor package to practice the teachings of the present invention.

The high density semiconductor package of the present invention has at least the following advantages.

A plurality of package modules are disposed on the same surface of the substrate, and therefore the thickness of the high density semiconductor package can be significantly reduced conforming the present trend of lightness, thinness, shortness, and smallness.

The arrangement of a plurality of package modules on the same surface of the package substrate renders the top surfaces of the package modules exposed unlike in the conventional MCM where a CPU is attached to the bottom surface, and therefore this arrangement allows mounting of a heat sink member on any of the package modules. For example, a heat sink member may be conveniently mounted onto a CPU package module to enhance the heat dissipation thereof.

A plurality of package modules can be arranged on the same surface of the package substrate in various arrangement so long as the gap width between the adjacent packages modules is wide enough to reliably apply the underfill material. Thus, the high-density package structure so formed will have the features of being high-density, thin, flat, short and small.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high density semiconductor package, comprising:

a substrate, having a surface;

a first package module, being disposed on the surface of the substrate; and a plurality of second package modules, being disposed on the surface of the substrate surrounding the first package module, wherein each of the second package modules has a corner near a corresponding one side of the first package module, wherein the corner is included from two sides of a corresponding one of the second package modules and the two sides are not parallel to the corresponding one side of the first package module.

2. The high density semiconductor package as claimed in claim 1, wherein a gap between the corner of the corresponding one of the second package modules and the corresponding one side of the first package module is larger than 2 mm.

3. The high density semiconductor package structure as claimed in claim 1, wherein the first package module is arranged coplanar with the second package modules.

4. The high density semiconductor package as claimed in claim 1, wherein the first package module comprises:

a chip;

a plurality of bumps located between the chip and the substrate; and an underfill located between the chip and the substrate and enveloping the bumps.

5. The high density semiconductor package as claimed in claim 1, wherein each of the second package modules comprises:

a chip;

a plurality of bumps located between the chip and the substrate; and an underfill located between the chip and the substrate and enveloping the bumps.

6. The high density semiconductor package as claimed in claim 1, wherein the first package module has four sides, and the number of the second package modules is four, respectively facing to the four sides.

7. The high density semiconductor package as claimed in claim 1, wherein the corner of each of the second package modules face the side of the first package module by a direction substantially perpendicular to one of the sides of the first package module.

* * * * *